(12) United States Patent
Peeters

(10) Patent No.: US 10,125,314 B2
(45) Date of Patent: Nov. 13, 2018

(54) LIGHTING DEVICE WITH CERAMIC GARNET

(71) Applicant: PHILIPS LIGHTING HOLDING B.V., Eindhoven (NL)

(72) Inventor: Martinus Petrus Joseph Peeters, Eindhoven (NL)

(73) Assignee: PHILIPS LIGHTING HOLDING B.V., Eindhoven (NL)

(*) Notice: Subject to any disclaimer, the term of this patent is extended or adjusted under 35 U.S.C. 154(b) by 0 days.

(21) Appl. No.: 15/761,145

(22) PCT Filed: Sep. 7, 2016

(86) PCT No.: PCT/EP2016/071084
§ 371 (c)(1),
(2) Date: Mar. 19, 2018

(87) PCT Pub. No.: WO2017/055041
PCT Pub. Date: Apr. 6, 2017

(65) Prior Publication Data
US 2018/0258345 A1 Sep. 13, 2018

(30) Foreign Application Priority Data
Sep. 29, 2015 (EP) .................................. 15187306

(51) Int. Cl.
*C09K 11/77* (2006.01)
*F21S 41/24* (2018.01)
(Continued)

(52) U.S. Cl.
CPC ............ *C09K 11/7774* (2013.01); *F21S 2/00* (2013.01); *F21S 41/24* (2018.01); *G02B 6/0003* (2013.01);
(Continued)

(58) Field of Classification Search
CPC .. C09K 11/7774; C09K 11/7766; F21S 41/24; F21S 2/00
See application file for complete search history.

(56) References Cited

U.S. PATENT DOCUMENTS 8,740,400 B2 * 6/2014 Tao ..................... F21V 33/0052
362/84
9,476,568 B2 * 10/2016 Tao ..................... F21V 33/0052
(Continued)

FOREIGN PATENT DOCUMENTS

WO   WO2006054203 A1   5/2006
WO   WO2007122543 A2   11/2007
(Continued)

OTHER PUBLICATIONS

CRC Handbook of Chemistry and Physics, 69th edition, E-208 and E-406, 1988-1989.

*Primary Examiner* — Anne Hines
(74) *Attorney, Agent, or Firm* — Akarsh P. Belagodu

(57) ABSTRACT

The invention provides a lighting device (1) comprising a plurality of solid state light sources (10) and an elongated ceramic body (100) having a first face (141) and a second face (142) defining a length (L) of the elongated ceramic body (100), the elongated ceramic body (100) comprising one or more radiation input faces (111) and a radiation exit window (112), wherein the second face (142) comprises said radiation exit window (112), 5 wherein the plurality of solid state light sources (10) are configured to provide blue light source light (11) to the one or more radiation input faces (111), wherein the blue light source light (11) has an peak maximum ($\lambda$ex1), wherein the elongated ceramic body (100) comprises a ceramic material (120) configured to wavelength convert at least part of the blue light source light (11) into converter light (101), wherein the ceramic material (120) comprises an 10 $A_3B_5O_{12}$:$Ce^{3+}$ ceramic material,
(Continued)

wherein A comprises yttrium (Y) and gadolinium (Gd), and wherein B comprises aluminum (Al), wherein A comprises in the range of 10-50 atom % Gd, and wherein the ceramic material (120) comprises 0.5-3.5 mole % Ce, wherein the ceramic material (120) comprises an absorption spectrum having an absorption peak maximum ($\lambda a$), wherein the peak maximum ($\lambda ex1$) is unequal to the absorption peak maximum ($\lambda a$).

11 Claims, 4 Drawing Sheets

(51) Int. Cl.
    *F21V 8/00*     (2006.01)
    *F21S 2/00*     (2016.01)
    *H01L 33/50*     (2010.01)
    *F21W 131/406*     (2006.01)
    *F21W 131/105*     (2006.01)
    *F21W 131/30*     (2006.01)
    *F21W 131/405*     (2006.01)

(52) U.S. Cl.
    CPC .......... *G02B 6/0046* (2013.01); *H01L 33/505* (2013.01); *F21W 2131/105* (2013.01); *F21W 2131/30* (2013.01); *F21W 2131/405* (2013.01); *F21W 2131/406* (2013.01)

(56) References Cited

U.S. PATENT DOCUMENTS

| | | |
|---|---|---|
| 2005/0269582 A1* | 12/2005 | Mueller .................. C04B 35/44 257/94 |
| 2011/0279022 A1 | 11/2011 | Winkler et al. |
| 2012/0218736 A1 | 8/2012 | Zhang et al. |
| 2012/0326344 A1 | 12/2012 | Kelso et al. |
| 2013/0292728 A1 | 11/2013 | Ishimori et al. |
| 2014/0175968 A1 | 6/2014 | Wataya et al. |
| 2014/0339593 A1 | 11/2014 | Clatterbuck et al. |
| 2015/0008818 A1 | 1/2015 | Miyagawa et al. |
| 2015/0144978 A1 | 5/2015 | Miyagawa et al. |

FOREIGN PATENT DOCUMENTS

| | | |
|---|---|---|
| WO | WO2014155250 A1 | 10/2014 |
| WO | WO2014202726 A1 | 12/2014 |

\* cited by examiner

LIGHTING DEVICE WITH CERAMIC GARNET

CROSS-REFERENCE TO PRIOR APPLICATIONS

This application is the U.S. National Phase application under 35 U.S.C. § 371 of International Application No. PCT/EP2016/071084, filed on Sep. 7, 2016, which claims the benefit of European Patent Application No. 15187306.4, filed on Sep. 29, 2015. These applications are hereby incorporated by reference herein.

FIELD OF THE INVENTION

The invention relates to a lighting device, such as for use in a projector.

BACKGROUND OF THE INVENTION

Luminescent rods are known in the art. WO2006/054203, for instance, describes a light emitting device comprising at least one LED which emits light in the wavelength range of >220 nm to <550 nm and at least one conversion structure placed towards the at least one LED without optical contact, which converts at least partly the light from the at least one LED to light in the wavelength range of >300 nm to ≤1000 nm, characterized in that the at least one conversion structure has a refractive index n of >1.5 and <3 and the ratio A:E is >2:1 and <50000:1, where A and E are defined as follows: the at least one conversion structure comprises at least one entrance surface, where light emitted by the at least one LED can enter the conversion structure and at least one exit surface, where light can exit the at least one conversion structure, each of the at least one entrance surfaces having an entrance surface area, the entrance surface area(s) being numbered $A_1 \ldots A_n$ and each of the at least one exit surface(s) having an exit surface area, the exit surface area(s) being numbered $E_1 \ldots E_n$ and the sum of each of the at least one entrance surface(s) area(s) A being $A=A_1+A_2 \ldots +A_n$ and the sum of each of the at least one exit surface(s) area(s) E being $E=E_1+E_2 \ldots +E_n$.

SUMMARY OF THE INVENTION

Luminescent ceramic garnets doped with $Ce^{3+}$ (trivalent cerium) can be used to convert blue light into light with a longer wavelength, e.g. within the green to red wavelength region, such as in the range of about 500-750 nm. To obtain sufficient absorption and light output in desired directions, it is advantageous to use transparent rods (especially substantially shaped as beams). Such rod can be used as light concentrator, concentrating over their length light source light from light sources such as LEDs (light emitting diodes), converting this light source light into converter light and providing at an exit surface a substantial amount of converter light. Lighting devices based on light concentrators may e.g. be of interest for projector applications.

For projectors, red and green luminescent concentrators are of interest. Green luminescent rods, based on garnets, can be relatively efficient. Such concentrators are especially based on YAG:Ce (i.e. $Y_3Al_5O_{12}:Ce^{3+}$) or LuAG ($Lu_3Al_5O_{12}:Ce^{3+}$). 'Red' garnets can be made by doping a YAG-garnet with Gd ("YGdAG"). Doping of Gd, however, results in a lower thermal stability (thermal quenching). Red-shifting can also be obtained using a high Ce concentration, with a much smaller penalty for thermal stability.

The red shift is much more sensitive to the increase in cerium content then to the increase in gadolinium. For a light concentrator with sufficient red spectral intensity and acceptable thermal quenching properties, it appears that both the cerium increase and the gadolinium increase (relative to the green concentrator) are necessary.

It surprisingly appeared, however, that when increasing the cerium concentration and increasing the Gd concentration, the efficiency of the light converter (especially light concentrator) was substantially lower than expected based on e.g. powder samples having identical compositions leading to green and substantially red shifted light, respectively. Apart from the Stokes shift losses, the efficiency was substantially smaller (30-70% or less from the expected efficiency). The term "efficiency" especially here relates to the relation power out/power in, where "power out" refers to the light escaping from a light exit window, especially at an end of the ceramic body (see also below), and 'power in" relates to the power of the light sources used to irradiated the ceramic body.

Hence, it is an aspect of the invention to provide an alternative lighting device, which preferably further at least partly obviates one or more of above-described drawbacks, and which may have substantial emission in the red with a good efficiency. It is also an aspect of the invention to provide an alternative projector or projector device, which preferably further at least partly obviates one or more of above-described drawbacks.

It was surprisingly found that the efficiency can substantially be increased when the excitation wavelength of the light sources was not tuned to maximum absorption (which is in general the default mode to get the highest output) but offset from the excitation maximum. Hence, for instance assuming an excitation maximum of the cerium doped garnet emission at about 450 nm, the efficiency increases when tuning the wavelength offset from 450 nm, such as in the range of 460-470 nm or 430-440 nm. Hence, it surprisingly appeared beneficial to select light sources that do not have their emission maximum at the excitation maximum (in the blue) of the red emitting garnet.

Hence, in a first aspect, the invention provides a lighting device ("device") comprising a plurality of solid state light sources (such as at least 10, like at least 50) and a ceramic body, especially an elongated ceramic body (herein also indicated as "light concentrator") having a first face and a second face, these first face and second face especially defining a length (L) of the elongated ceramic body (herein also indicated as "ceramic body"), the elongated ceramic body comprising one or more radiation input faces and a radiation exit window, wherein the second face comprises said radiation exit window, wherein the plurality of solid state light sources are configured to provide (blue) light source light to the one or more radiation input faces, wherein the blue light source light has a peak maximum (λex1), wherein the elongated ceramic body comprises a ceramic material configured to wavelength convert at least part of the blue light source light into converter light, wherein the ceramic material comprises an $A_3B_5O_{12}:Ce^{3+}$ ceramic material, wherein A comprises yttrium (Y) and gadolinium (Gd), and wherein B comprises aluminum (Al), wherein A especially comprises in the range of 10-50 atom % Gd, even more especially 20-40 atom % Gd, wherein A further especially comprises in the range of 50-90 atom % Y, even more especially 60-80 atom % Y, and wherein the ceramic material especially comprises 0.4-3.5 mole % Ce, yet even more especially 0.5-3.5 mole % Ce, especially at least 1 mole %, wherein the ceramic material comprises an absorption spectrum having an absorption peak maximum ($\lambda a$), wherein the peak maximum ($\lambda ex1$) is unequal to the absorption peak maximum ($\lambda a$).

With the offset excitation and the specific concentrations of Gd and Ce, a lighting device, i.e. especially a light concentrator device, is obtained that emits at least in the red and has a relatively high efficiency, higher then when exciting at the absorption maximum. Choosing lower or higher concentrations of Gd or Ce leads to converters that do not provide enough emission in the red (i.e. less efficient) and/or which substantially reduce in intensity with increasing the temperature. The present conditions appear to provide a good compromise between intensity, efficiency, thermal stability and spectral distribution.

The light sources may have slightly differing peak maxima (binning) Should this be the case, as peak maximum an average of the peak maxima may be applied. Should also the intensity vary between the light sources, then an intensity averaged peak maximum may be applied as peak maximum ($\lambda ex1$).

The peak maximum ($\lambda ex1$) is selected to differ in the range of 10-35 nm, especially in the range of 10-30 nm, more especially in the range of 15-30 nm, yet even more especially in the range of 15-25 nm from the absorption peak maximum ($\lambda a$). Differences smaller than about 10 nm may not differ enough from the maximum to have effect on the efficiency, whereas differences larger than about 30 nm may not have a substantial added value to the efficiency and may further lead to relative inefficiency devices in the sense that a substantial increase in light source intensity (or number of light sources) is necessary. Especially, the difference is at least 15 nm. With the offset excitation and the Gd and Ce concentrations, the efficiency can substantially be increased, much closer to the theoretically estimated value. Especially, good results can be obtained with $\lambda ex1 < \lambda a$.

The term "light concentrator" is herein used, as a plurality of light sources irradiate a relative large surface (area) of the light converter, and a lot of converter light escapes from a relatively small area (exit window) of the light converter. Thereby, the specific configuration of the light converter provides its light concentrator properties.

Here below, some aspect in relation to the ceramic body are elucidated. These are especially described in relation to an elongated ceramic body, such as a ceramic rod. However, these aspects may also be relevant for other shaped ceramic bodies.

Especially, the elongated ceramic body comprises a ceramic material configured to wavelength convert at least part of the (blue) light source light into converter light in the red, which converter light at least partly escapes from the radiation exit window.

The ceramic material especially comprises an $A_3B_5O_{12}$:$Ce^{3+}$ ceramic material ("ceramic garnet"), wherein A comprises yttrium (Y) and gadolinium (Gd), and wherein B comprises aluminum (Al). As further indicated below, A may also refer to other rare earth elements and B may include Al only, but may optionally also include gallium. The formula $A_3B_5O_{12}$:$Ce^{3+}$ especially indicates the chemical formula, i.e. the stoichiometry of the different type of elements A, B and O (3:5:12). However, as known in the art the compounds indicated by such formula may optionally also include a small deviation from stoichiometry.

In yet a further aspect, the invention also provides such elongated ceramic body per se, i.e. an elongated ceramic body having a first face and a second face, these faces especially defining the length (L) of the elongated ceramic body, the elongated ceramic body comprising one or more radiation input faces and a radiation exit window, wherein the second face comprises said radiation exit window, wherein the elongated ceramic body comprises a ceramic material configured to wavelength convert at least part of (blue) light source light into converter light, such as (at least) red converter light (which at least partly escapes from the radiation exit window when the elongated ceramic body is irradiated with blue light source light), wherein the ceramic material comprises an $A_3B_5O_{12}$:$Ce^{3+}$ ceramic material as defined herein. Such ceramic body can thus be used as light converter. Especially, such ceramic body has the shape of a cuboid.

As indicated above, the ceramic material comprises a garnet material. Hence, the elongated body especially comprises a luminescent ceramic. The garnet material, especially the ceramic garnet material, is herein also indicated as "luminescent material". The luminescent material comprises an $A_3B_5O_{12}$:$Ce^{3+}$ (garnet material), wherein A is especially selected from the group consisting of Sc, Y, Tb, Gd, and Lu (especially at least Y and Gd), wherein B is especially selected from the group consisting of Al and Ga (especially at least Al). More especially, A (essentially) comprises yttrium (Y) and gadolinium (Gd), and B (essentially) comprises aluminum (Al). Such garnet is be doped with cerium (Ce), and optionally with other luminescent species such as praseodymium (Pr).

As indicated above, the element A may especially be selected from the group consisting of yttrium (Y) and gadolinium (Gd). Hence, $A_3B_5O_{12}$:$Ce^{3+}$ especially refers to $(Y_{1-x}Gd_x)_3B_5O_{12}$:$Ce^{3+}$, wherein especially x is in the range of 0.1-0.5, even more especially in the range of 0.2-0.4, yet even more especially 0.2-0.35. Hence, A may comprise in the range of 50-90 atom % Y, even more especially at least 60-80 atom % Y, yet even more especially 65-80 atom % of A comprises Y. Further, A comprises thus especially at least 10 atom % Gd, such as in the range of 10-50 atom % Gd, like 20-40 atom %, yet even more especially 20-35 atom % Gd.

Especially, B comprises aluminum (Al), however, B may also partly comprise gallium (Ga) and/or scandium (Sc) and/or indium (In), especially up to about 20% of Al, more especially up to about 10% of Al may be replaced (i.e. the A ions essentially consist of 90 or more mole % of Al and 10 or less mole % of one or more of Ga, Sc and In); B may especially comprise up to about 10% gallium. Therefore, B may comprise at least 90 atom % Al. Hence, $A_3B_5O_{12}$:$Ce^{3+}$ especially refers to $(Y_{1-x}Gd_x)_3Al_5O_{12}$:$Ce^{3+}$, wherein especially x is in the range of 0.1-0.5, even more especially in the range of 0.2-0.4.

In another variant, B (especially Al) and O may at least partly be replaced by Si and N. Optionally, up to about 20% of Al—O may be replaced by Si—N, such as up to 10%.

For the concentration of cerium, the indication n mole % Ce indicates that n % of A is replaced by cerium. Hence, $A_3B_5O_{12}$:$Ce^{3+}$ may also be defined as $(A_{1-n}Ce_n)_3B_5O_{12}$, with n being in the range of 0.005-0.035. Therefore, a garnet essentially comprising Y and mole Ce may in fact refer to $((Y_{1-x}Gd_x)_{1-n}Ce_n)_3B_5O_{12}$, with x and n as defined above.

Especially, the ceramic material is obtainable by a sintering process and/or a hot pressing process, optionally followed by an annealing in an (slightly) oxidizing atmosphere. The term "ceramic" especially relates to an inorganic material that is—amongst others—obtainable by heating a (poly crystalline) powder at a temperature of at least 500° C., especially at least 800° C., such as at least 1000° C., like at least 1400° C., under reduced pressure, atmospheric pressure or high pressure, such as in the range of $10^{-8}$ to 500 MPa, such as especially at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicate above. The ceramic obtainable by such method may be used as such, or may be further processed (like polishing). A ceramic especially has density that is at least 90% (or higher, see below), such as at least 95%, like in the range of 97-100%, of the theoretical density (i.e. the density of a single crystal). A ceramic may still be polycrystalline, but with a reduced, or strongly reduced volume between grains (pressed particles or pressed agglomerate particles). The heating under elevated pressure, such as HIP, may e.g. be performed in an inert gas, such as comprising one or more of $N_2$ and argon (Ar). Especially, the heating under elevated pressures is preceded by a sintering process at a temperature selected from the range of 1400-1900° C., such as 1500-1800° C. Such sintering may be performed under reduced pressure, such as at a pressure of $10^{-2}$ Pa or lower. Such sintering may already lead to a density of in the order of at least 95%, even more especially at least 99%, of the theoretical density. After both the pre-sintering and the heating, especially under elevated pressure, such as HIP, the density of the ceramic body can be close to the density of a single crystal. However, a difference is that grain boundaries are available in the ceramic body, as the ceramic body is polycrystalline. Such grain boundaries can e.g. be detected by optical microscopy or SEM. Hence, herein the ceramic body especially refers to a sintered polycrystalline having a density substantially identical to a single crystal (of the same material). Such body may thus be highly transparent for visible light (except for the absorption by the light absorbing species such as especially $Ce^{3+}$).

After obtaining the ceramic body, the body may be polished. Before or after polishing an annealing process (in an oxidative atmosphere) may be executed, especially before polishing. In a further specific embodiment, said annealing process lasts for at least 2 hours, such as at least 2 hours at at least 1200° C. Further, especially the oxidizing atmosphere comprises for example $O_2$.

The ceramic body has light guiding or wave guiding properties. Hence, the ceramic body is herein also indicated as wave guide or light guide. As the ceramic body is used as light concentrator, the ceramic body is herein also indicated as light concentrator. The ceramic body will in general have (some) transmission of visible light in a direction perpendicular to the length of the ceramic body. Without the activator such as trivalent cerium, the transmission in the visible might be close to 100%.

Herein, the term "visible light" especially relates to light having a wavelength selected from the range of 380-780 nm. The transmission can be determined by providing light at a specific wavelength with a first intensity to the ceramic body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1988-1989).

The ceramic body may have any shape, such as beam like or rod like, however especially beam like (cuboid like). However, the ceramic body may also be disk like, etc. The invention is not limited to specific embodiments of shapes, neither is the invention limited to embodiments with a single exit window or outcoupling face. Below, some specific embodiments are described in more detail. Would the ceramic body have a circular cross-section, then the width and height may be equal (and may be defined as diameter). Especially, however, the ceramic body has a cuboid like shape and is further configured to provide a single exit window.

In a specific embodiment, the ceramic body may especially have an aspect ratio larger than 1, i.e. the length is larger than the width. In general, the ceramic body is a rod or bar (beam), though the ceramic body does not necessarily have a square, rectangular or round cross-section. In general, the light source is configured to irradiate one of the longer faces (side edge), herein indicated as radiation input face, and radiation escapes from a face at a front (front edge), herein indicated as radiation exit window. Especially, in embodiments the solid state light source, or other light source, is not in physical contact with the ceramic body. Physical contact may lead to undesired outcoupling and thus a reduction in concentrator efficiency. Further, in general the ceramic body comprises two substantially parallel faces, the radiation input face and opposite thereof the opposite face. These two faces define herein the width of the ceramic body. In general, the length of these faces defines the length of the ceramic body. However, as indicated above, and also below, the ceramic body may have any shape, and may also include combinations of shapes. Especially, the radiation input face has an radiation input face area (A), wherein the radiation exit window has a radiation exit window area (E), and wherein the radiation input face area (A) is at least 1.5 times, even more especially at least two times larger than the radiation exit window area (E), especially at least 5 times larger, such as in the range of 2-50,000, especially 5-5,000 times larger. Hence, especially the elongated ceramic body comprises a geometrical concentration factor, defined as the ratio of the area of the radiation input faces and the area of the radiation exit window, of at least 1.5, such as at least 2, like at least 5, or much larger (see above). This allows e.g. the use of a plurality of solid state light sources (see also below). For typical applications like in automotive or digital projectors, a small but high intense emissive surface is desired. This cannot be obtained with a single LED, but can be obtained with the present lighting device. Especially, the radiation exit window has a radiation exit window area (E) selected from the range of 1-100 $mm^2$. With such dimensions, the emissive surface can be small, whereas nevertheless high intensity may be achieved. As indicated above, the ceramic body in general has an aspect ratio (of length/width). This allows a small radiation exit surface, but a large radiation input surface, e.g. irradiated with a plurality of solid state light sources. In a specific embodiment, the ceramic body has a width (W) selected from the range of 0.5-100 mm. The ceramic body is thus especially an integral body, having the herein indicated faces.

The generally rod shaped or bar shaped ceramic body can have any cross sectional shape, but in embodiments has a cross section the shape of a square, rectangle, round, oval, triangle, pentagon, or hexagon. Generally the ceramic bodies are cuboid, but may be provided with a different shape than a cuboid, with the light input surface having somewhat the shape of a trapezoid. By doing so, the light flux may be even enhanced, which may be advantageous for some applications. Hence, in some instances (see also above) the term "width" may also refer to diameter, such as in the case of a ceramic body having a round cross section. Hence, in embodiments the elongated ceramic body further has a width (W) and a height (H), with especially L>W and L>H.

Especially, the first face and the second face define the length, i.e. the distance between these faces is the length of the elongated ceramic body. These faces may especially be arranged parallel. Further, in a specific embodiment the length (L) is at least 2 cm, such as 10-20 cm.

Especially, the ceramic body has a width (W) selected to absorb more than 95% of the light source light. In embodiments, the ceramic body has a width (W) selected from the range of 0.05-4 cm, especially 0.1-2 cm, such as 0.2-1.5 cm. With the herein indicated cerium concentration, such width is enough to absorb substantially all light generated by the light sources.

The ceramic body may also be a cylindrically shaped rod. In embodiments the cylindrically shaped rod has one flattened surface along the longitudinal direction of the rod and at which the light sources may be positioned for efficient incoupling of light emitted by the light sources into the ceramic body. The flattened surface may also be used for placing heat sinks. The cylindrical ceramic body may also have two flattened surfaces, for example located opposite to each other or positioned perpendicular to each other. In embodiments the flattened surface extends along a part of the longitudinal direction of the cylindrical rod. Especially however, the edges are planar and configured perpendicular to each other.

The ceramic body as set forth below in embodiments according to the invention may also be folded, bended and/or shaped in the length direction such that the ceramic body is not a straight, linear bar or rod, but may comprise, for example, a rounded corner in the form of a 90 or 180 degrees bend, a U-shape, a circular or elliptical shape, a loop or a 3-dimensional spiral shape having multiple loops. This provides for a compact ceramic body of which the total length, along which generally the light is guided, is relatively large, leading to a relatively high lumen output, but can at the same time be arranged into a relatively small space. For example luminescent parts of the ceramic body may be rigid while transparent parts of the ceramic body are flexible to provide for the shaping of the ceramic body along its length direction. The light sources may be placed anywhere along the length of the folded, bended and/or shaped ceramic body.

Parts of the ceramic body that are not used as light incoupling area or light exit window may be provided with a reflector. Hence, in an embodiment the lighting device further comprises a reflector configured to reflect luminescent material light back into the ceramic body. Therefore, the lighting device may further include one or more reflectors, especially configured to reflect radiation back into the ceramic body that escapes from one or more other faces than the radiation exit window. Especially, a face opposite of the radiation exit window may include such reflector, though in an embodiment not in physical contact therewith. Hence, the reflectors may especially not be in physical contact with the ceramic body. Therefore, in an embodiment the lighting device further comprises an optical reflector (at least) configured downstream of the first face and configured to reflect light back into the elongated ceramic body. Alternatively or additionally, optical reflectors may also be arranged at other faces and/or parts of faces that are not used to couple light source light in or luminescence light out. Especially, such optical reflectors may not be in physical contact with the ceramic body. Further, such optical reflector(s) may be configured to reflect one or more of the luminescence and light source light back into the ceramic body. Hence, substantially all light source light may be reserved for conversion by the luminescent material (i.e. the activator element(s) such as especially $Ce^{3+}$) and a substantial part of the luminescence may be reserved for outcoupling from the radiation exit window. The term "reflector" may also refer to a plurality of reflectors.

The terms "coupling in" and similar terms and "coupling out" and similar terms indicate that light changes from medium (external from the ceramic body into the ceramic body, and vice versa, respectively). In general, the light exit window will be a face (or a part of a face), configured (substantially) perpendicular to one or more other faces of the waveguide. In general, the ceramic body will include one or more body axes (such as a length axis, a width axis or a height axis), with the exit window being configured (substantially) perpendicular to such axis. Hence, in general, the light input face(s) will be configured (substantially) perpendicular to the light exit window. Thus, the radiation exit window is especially configured perpendicular to the one or more radiation input faces. Therefore, especially the face comprising the light exit window does not comprise a light input face.

Downstream of the radiation exit window, optionally an optical filter may be arranged. Such optical filter may be used to remove undesired radiation. For instance, when the lighting device should provide red light, all light other than red may be removed. Hence, in a further embodiment the lighting device further comprises an optical filter configured downstream of the radiation exit window and configured to reduce the relative contribution of non-red light in the converter light (downstream of the radiation exit window). For filtering out light source light, optionally an interference filter may be applied. Likewise this may apply to another color, when a color other than green and red is desired.

In yet a further embodiment, the lighting device further comprises a collimator configured downstream of the radiation exit window and configured to collimate the converter light. Such collimator, like e.g. a CPC (compound parabolic concentrator), may be used to collimate the light escaping from the radiation exit window and to provide a collimated beam of light.

Further, the lighting device may include a heat sink configured to facilitate cooling of the solid state light source and/or luminescent concentrator. The heat sink may comprise or consist of copper, aluminum, silver, gold, silicon carbide, aluminum nitride, boron nitride, aluminum silicon carbide, beryllium oxide, silicon-silicon carbide, aluminum silicon carbide, copper tungsten alloys, copper molybdenum carbides, carbon, diamond, graphite, and combinations of two or more thereof. The lighting device may further include one or more cooling elements configured to cool the ceramic body.

Especially, the light sources are light sources that during operation emit (light source light) at least light at a wavelength selected from the range of 200-490 nm, especially light sources that during operation emit at least light at wavelength selected from the range of 400-490 nm, even more especially in the range of 440-490 nm. This light may partially be used by the luminescent material. Hence, in a specific embodiment, the light source is configured to generate blue light. In a specific embodiment, the light source comprises a solid state LED light source (such as a LED or laser diode). The term "light source" may also relate to a plurality of light sources, such as e.g. 2-20 (solid state) LED light sources, though many more light sources may be applied. Hence, the term LED may also refer to a plurality of LEDs. Hence, as indicated herein, the term "solid state light source" may also refer to a plurality of solid state light sources. In an embodiment (see also below), these are substantially identical solid state light sources, i.e. providing substantially identical spectral distributions of the solid state light source radiation. In embodiments, the solid state light sources may be configured to irradiate different faces of the ceramic body.

The lighting device comprises a plurality of light sources. Especially, the light source light of the plurality (m) of light sources have spectral overlap, even more especially, they are of the same type and provide substantial identical light (having thus substantial the same spectral distribution). Hence, the light sources may substantially have the same emission maximum ("peak maximum"), such as within a bandwidth of 10 nm., especially within 8 nm, such as within 5 nm (binning).

The light sources are especially configured to provide a blue optical power ($W_{opt}$) of at least 0.2 Watt/mm² to the ceramic body, i.e. to the radiation input face(s). The blue optical power is defined as the energy that is within the energy range that is defined as blue part of the spectrum (see also below). Especially, the photon flux is in average at least $4.5*10^{17}$ photons/(s·mm²), such as at least $6.0*10^{17}$ photons/(s·mm²). Assuming blue (excitation) light, this may e.g. correspond to a blue power ($W_{opt}$) provided to at least one of the radiation input faces of in average at least 0.067 Watt/mm² and 0.2 Watt/mm², respectively. Here, the term "in average" especially indicates an average over the area (of the at least one of the radiation input surfaces). When more than one radiation input surface is irradiated, then especially each of these radiation input surfaces receives such photon flux. Further, especially the indicated photon flux (or blue power when blue light source light is applied) is also an average over time.

In yet a further embodiment, especially for projector applications, the plurality of light sources are operated in pulsed operation with a duty cycle selected from the range of 10-80%, such as 25-70%.

In yet a further aspect, the invention provides a lighting unit configured to provide visible light, wherein the lighting unit comprises at least one lighting device as defined herein. For instance, such lighting unit may also comprise one or more (additional) optical elements, like one or more of optical filters, collimators, reflectors, wavelength converters, etc. The lighting unit may be, for example, a lighting unit for use in an automotive application, like a headlight. Hence, the invention also provides an automotive lighting unit configured to provide visible light, wherein the automotive lighting unit comprises at least one lighting device as defined herein and/or a digital projector unit comprising at least one lighting device as defined herein. Especially, the lighting device may be configured (in such applications) to provide red light. The automotive lighting unit or digital projector unit may also comprise a plurality of the lighting devices as described herein.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD back-lighting, etc.

In yet a further aspect, the invention provides a projector comprising the lighting device as defined herein. As indicated above, of course the light projector may also include a plurality of such lighting devices.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-570 nm. The terms "orange light" or "orange emission" especially relate to light having a wavelength in the range of about 570-600. The terms "red light" or "red emission" especially relate to light having a wavelength in the range of about 600-780 nm. The term "pink light" or "pink emission" refers to light having a blue and a red component. The terms "visible", "visible light" or "visible emission" refer to light having a wavelength in the range of about 380-780 nm.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

A light emitting device according to the invention may be used in applications including but not being limited to a lamp, a light module, a luminaire, a spot light, a flash light, a projector, a (digital) projection device, automotive lighting such as e.g. a headlight or a taillight of a motor vehicle, arena lighting, theater lighting and architectural lighting.

Light sources which are part of the embodiments according to the invention as set forth below, may be adapted for, in operation, emitting light with a first spectral distribution. This light is subsequently coupled into a light guide or waveguide; here the ceramic body. The light guide or waveguide may convert the light of the first spectral distribution to another spectral distribution and guides the light to an exit surface.

Figure 1A:
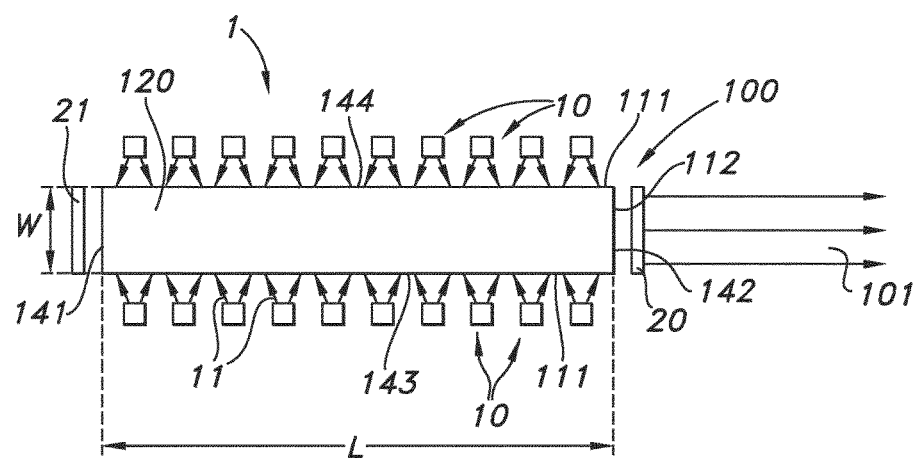
FIGS. 1a-1d schematically depict some aspects of the invention.

An embodiment of the lighting device as defined herein is schematically depicted in FIG. 1a. FIG. 1a schematically depicts a lighting device 1 comprising a plurality of solid state light sources 10 and an elongated ceramic body 100 having a first face 141 and a second face 142 defining a length L of the elongated ceramic body 100. The elongated ceramic body 100 comprising one or more radiation input faces 111, here by way of example two oppositely arranged faces, indicated with references 143 and 144 (which define e.g. the width W). Further the ceramic body 100 comprises a radiation exit window 112, wherein the second face 142 comprises said radiation exit window 112. The entire second face 142 may be used or configured as radiation exit window. The plurality of solid state light sources 10 are configured to provide (blue) light source light 11 to the one or more radiation input faces 111. As indicated above, they especially are configured to provide to at least one of the radiation input faces 111 a blue power $W_{opt}$ of in average at least 0.067 Watt/mm².

The elongated ceramic body 100 comprises a ceramic material 120 configured to wavelength convert at least part of the (blue) light source light 11 into converter light 101, such as at least one or more of green and red converter light 101. As indicated above the ceramic material 120 comprises an $A_3B_5O_{12}$:$Ce^{3+}$ ceramic material, wherein A comprises e.g. one or more of yttrium (Y), gadolinium (Gd) and lutetium (Lu), and wherein B comprises e.g. aluminum (Al). References 20 and 21 indicate an optical filter and a reflector, respectively. The former may reduce e.g. non-green light when green light is desired or may reduce non-red light when red light is desired. The latter may be used to reflect light back into the ceramic body or waveguide, thereby improving the efficiency. Note that more reflectors than the schematically depicted reflector may be used.

The light sources may in principle be any type of point light source, but is in an embodiment a solid state light source such as a Light Emitting Diode (LED), a Laser Diode or Organic Light Emitting Diode (OLED), a plurality of LEDs or Laser Diodes or OLEDs or an array of LEDs or Laser Diodes or OLEDs, or a combination of any of these. The LED may in principle be an LED of any color, or a combination of these, but is in an embodiment a blue light source producing light source light in the UV and/or blue color-range which is defined as a wavelength range of between 380 nm and 490 nm. In another embodiment, the light source is an UV or violet light source, i.e. emitting in a wavelength range of below 420 nm. In case of a plurality or an array of LEDs or Laser Diodes or OLEDs, the LEDs or Laser Diodes or OLEDs may in principle be LEDs or Laser Diodes or OLEDs of two or more different colors, such as, but not limited to, UV, blue, green, yellow or red.

Figure 1B:
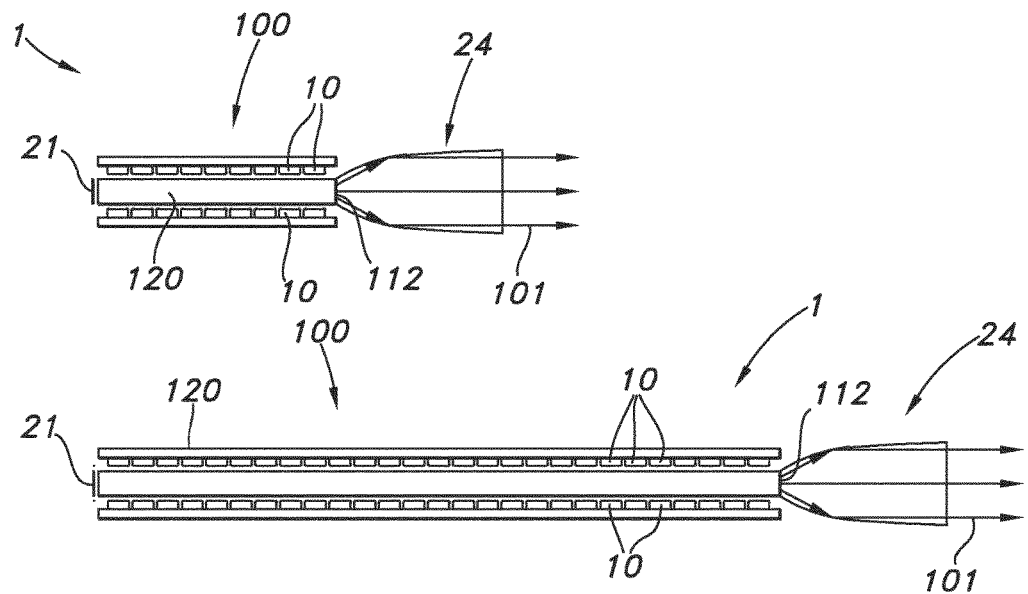

FIGS. 1a-1b schematically depict similar embodiments of the lighting device. Further, the lighting device may include further optical elements, either separate from the waveguide and/or integrated in the waveguide, like e.g. a light concentrating element, such as a compound parabolic light concentrating element (CPC). The lighting devices 1 in FIG. 1b further comprise a collimator 24, such as a CPC.

Figure 1C:
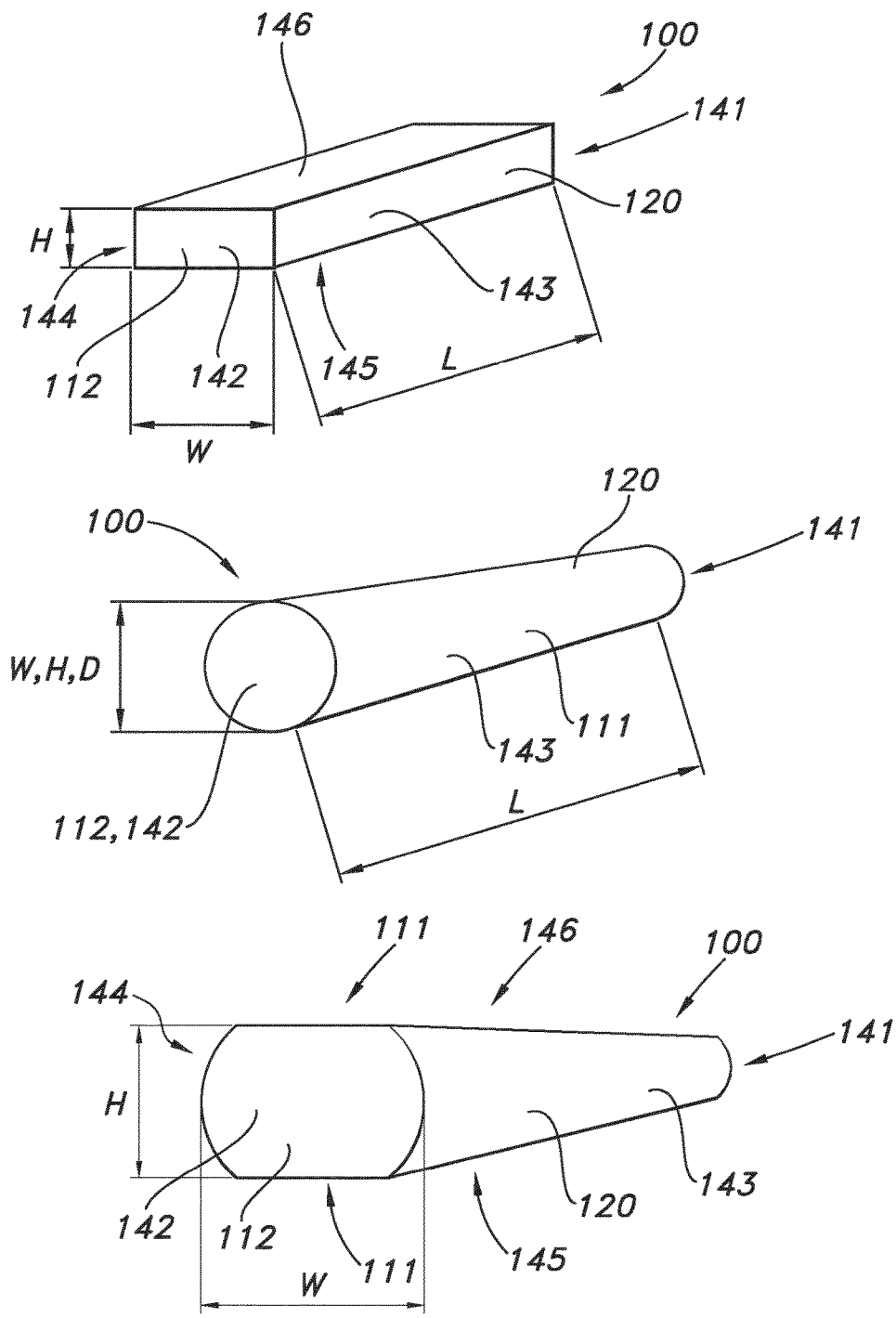

FIG. 1c schematically depicts some embodiments of possible ceramic bodies as waveguides or luminescent concentrators. The faces are indicated with references 141-146. The first variant, a plate-like or beam-like ceramic body has the faces 141-146. Light sources, which are not shown, may be arranged at one or more of the faces 143-146. The second variant is a tubular rod, with first and second faces 141 and 142, and a circumferential face 143. Light sources, not shown, may be arranged at one or more positions around the ceramic body. Such ceramic body will have a (substantially) circular or round cross-section. The third variant is substantially a combination of the two former variants, with two curved and two flat side faces. The variants shown in FIG. 1c are not limitative. More shapes are possible; i.e. for instance referred to WO2006/054203, which is incorporated herein by reference. The ceramic bodies, which are used as light guides, generally may be rod shaped or bar shaped light guides comprising a height H, a width W, and a length L extending in mutually perpendicular directions and are in embodiments transparent, or transparent and luminescent. The light is guided generally in the length L direction. The height H is in embodiments <10 mm, in other embodiments <5 mm, in yet other embodiments <2 mm. The width W is in embodiments <10 mm, in other embodiments <5 mm, in yet embodiments <2 mm. The length L is in embodiments larger than the width W and the height H, in other embodiments at least 2 times the width W or 2 times the height H, in yet other embodiments at least 3 times the width W or 3 times the height H. Hence, the aspect ratio (of length/width) is especially larger than 1, such as equal to or larger than 2, such as at least 5, like even more especially in the range of 10-100, such as 10-60, like 10-20. Unless indicated otherwise, the term "aspect ratio" refers to the ratio length/width.

The aspect ratio of the height H:width W is typically 1:1 (for e.g. general light source applications) or 1:2, 1:3 or 1:4 (for e.g. special light source applications such as headlamps) or 4:3, 16:10, 16:9 or 256:135 (for e.g. display applications). The light guides generally comprise a light input surface and a light exit surface which are not arranged in parallel planes, and in embodiments the light input surface is perpendicular to the light exit surface. In order to achieve a high brightness, concentrated, light output, the area of light exit surface may be smaller than the area of the light input surface. The light exit surface can have any shape, but is in an embodiment shaped as a square, rectangle, round, oval, triangle, pentagon, or hexagon.

Figure 1D:
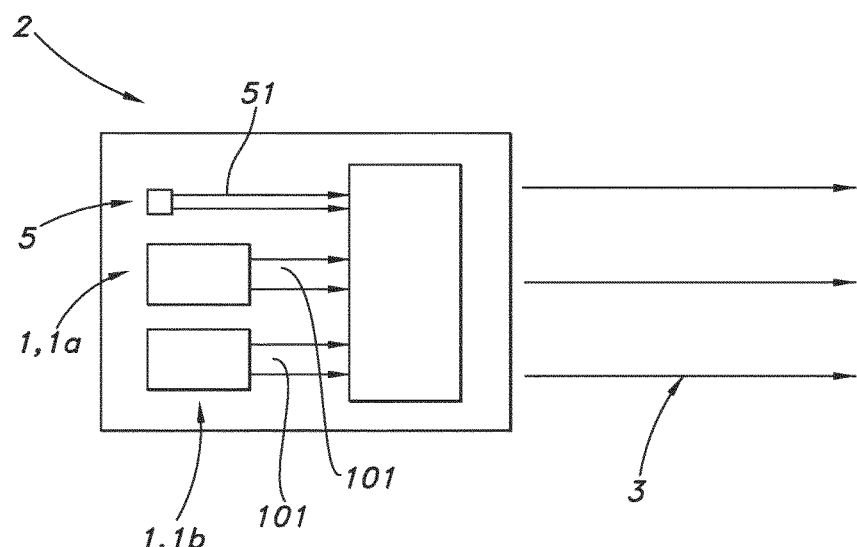

FIG. 1d very schematically depicts a projector or projector device 2 comprising the lighting device 1 as defined herein. By way of example, here the projector 2 comprises at least two lighting devices 1, wherein a first lighting device (1a) is configured to provide e.g. green light 101 and wherein a second lighting device (1b) is configured to provide e.g. red light 101. Light source 5 is configured to provide blue light. These light sources may be used to provide the projection 3.

Figure 2:
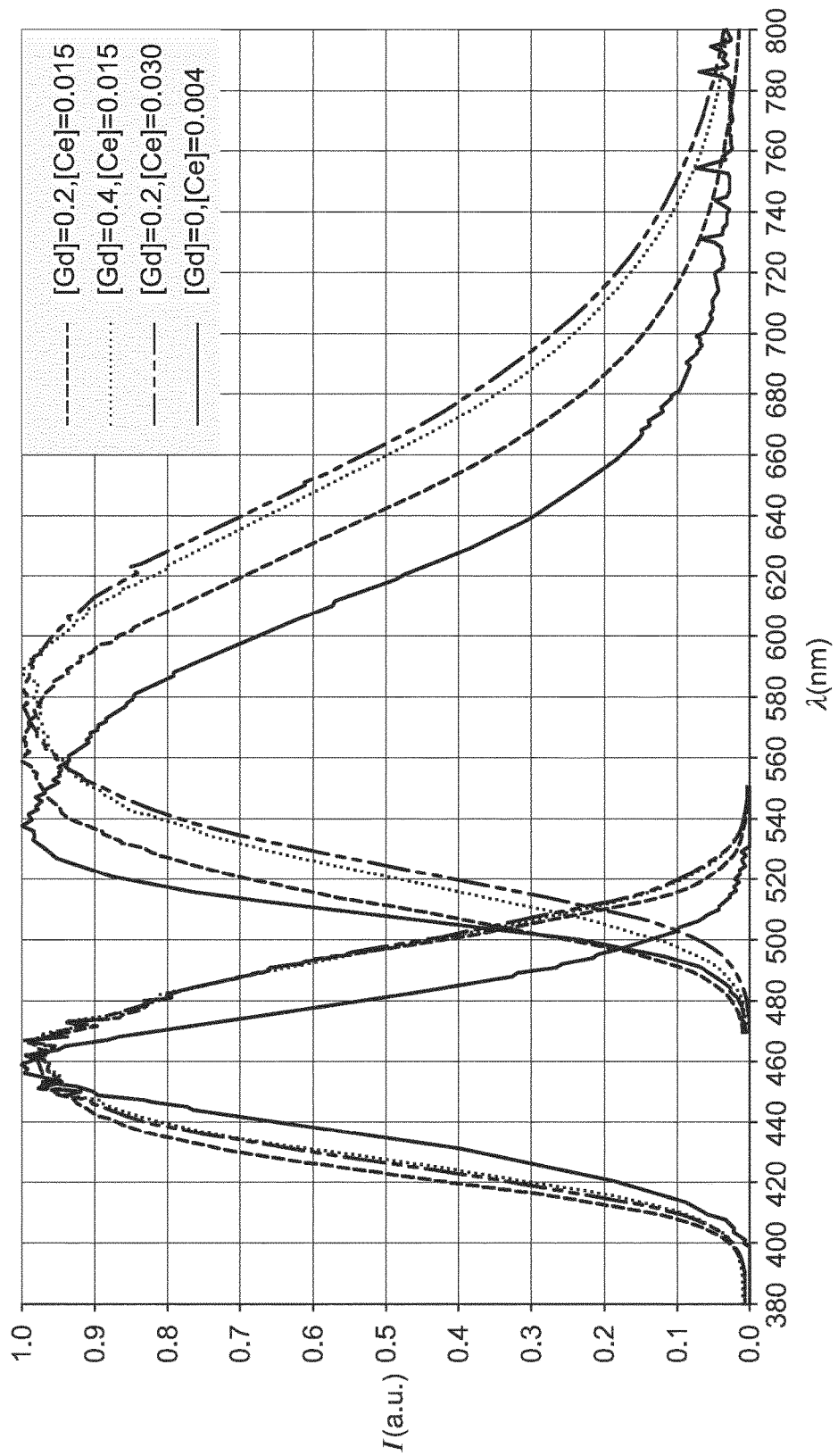
FIG. 2 shows absorption and emission spectra of some luminescent materials used for ceramic bodies at different concentrations of Gd and Ce, with the absorption and emission spectra normalized to 1; "a.u." indicates arbitrary units.

FIG. 2 shows excitation spectra and concomitant emission spectra of YAG:Ce (with 0.4% Ce) ([Gd]=0; [Ce]=0.004), which may well be used as light concentrator for generating green light, and three examples as defined in the present invention, with 20% or 40% Gd (two examples), and with 1.5% Ce and 3% Ce. It appears beneficial that concentrators based ceramic bodies of such luminescent materials (with Gd) are excited at a wavelength with about 30-70% of the maximum absorption. This advantageous effect is not perceived (or substantially negligible for a luminescent concentrator for green light based on YAG:Ce).

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

The invention claimed is:

1. A lighting device comprising a plurality of solid state light sources and an elongated ceramic body having a first face and a second face defining a length (L) of the elongated ceramic body, the elongated ceramic body comprising one or more radiation input faces and a radiation exit window, wherein the second face comprises said radiation exit window, wherein the plurality of solid state light sources are configured to provide blue light source light to the one or more radiation input faces, wherein the blue light source light has an peak maximum ($\lambda$ex1), wherein the elongated ceramic body comprises a ceramic material configured to wavelength convert at least part of the blue light source light into converter light, wherein the ceramic material comprises an $A_3B_5O_{12}$:$Ce^{3+}$ ceramic material, wherein A comprises yttrium (Y) and gadolinium (Gd), and wherein B comprises aluminum (Al), wherein A comprises in the range of 10-50 atom % Gd, and wherein the ceramic material comprises 0.5-3.5 mole % Ce, wherein the ceramic material comprises an absorption spectrum having an absorption peak maximum ($\lambda$a), wherein the peak maximum ($\lambda$ex1) is selected to differ in the range of 10-35 nm from the absorption peak maximum ($\lambda$a).

2. The lighting device according to claim 1, wherein the peak maximum ($\lambda$ex1) is selected to differ in the range of 10-25 nm from the absorption peak maximum ($\lambda$a).

3. The lighting device according to claim 1, wherein the ceramic body comprises a poly crystalline ceramic material.

4. The lighting device according to claim 1, wherein A comprises in the range of 60-80 atom % Y and wherein B comprises at least 90 atom % Al.

5. The lighting device according to claim 1, wherein the ceramic body has a width (W) selected to absorb more than 95% of the light source light.

6. The lighting device according to claim 1, wherein the ceramic body has a width (W) selected from the range of 0.1-2 cm, an aspect ratio of at least 10, and wherein A comprises in the range of 20-40 atom % Gd, and wherein the ceramic material comprises 0.5-3.0 mole % Ce.

7. The lighting device according to claim 1, further comprising an optical reflector configured downstream of the first face and configured to reflect light back into the elongated ceramic body, wherein the radiation exit window is configured perpendicular to the one or more radiation input faces.

8. The lighting device according to claim 1, further comprising an optical filter configured downstream of the radiation exit window and configured to reduce the relative contribution of non-red light in the converter light.

9. The lighting device according to claim 1, wherein the length (L) is at least 20 mm, and wherein the plurality of light sources are configured to provide to at least one of the radiation input faces a photon flux of at least $1.0*10^{17}$ photons/(s·mm$^2$).

10. The lighting device according to claim 1, wherein the elongated ceramic body comprises a geometrical concentration factor, defined as the ratio of the area of the radiation input faces and the area of the radiation exit window, of at least 2, and wherein the lighting device further comprising a collimator configured downstream of the radiation exit window and configured to collimate the converter light.

11. A projector comprising the lighting device according to claim 1.

* * * * *